United States Patent [19]

Wiedmann

[11] 4,158,237
[45] Jun. 12, 1979

[54] MONOLITHICALLY INTEGRATED STORAGE CELLS

[75] Inventor: Siegfried K. Wiedmann, Peekskill, N.Y.

[73] Assignee: International Business Machines Corporation, Armonk, N.Y.

[21] Appl. No.: 924,116

[22] Filed: Jul. 13, 1978

[30] Foreign Application Priority Data

Aug. 27, 1977 [DE] Fed. Rep. of Germany ....... 2738678

[51] Int. Cl.² .............................................. G11C 11/40
[52] U.S. Cl. ..................................... 365/154; 357/45; 307/238
[58] Field of Search ............... 307/238, 279, 290, 291; 365/154, 156, 174; 357/40, 45

[56] References Cited

U.S. PATENT DOCUMENTS 4,021,786  5/1977  Peterson ............................... 365/156

Primary Examiner—Terrell W. Fears
Attorney, Agent, or Firm—Stephen J. Limanek

[57] ABSTRACT

The invention relates to a monolithically integrated storage cell which includes a flip-flop circuit with two cross-coupled, bipolar switching transistors and one load element each connected by means of one terminal to the collectors of the switching transistors, the storage cell being controlled via a word line connected to the other terminal of both load elements and via one bit line each of a bit line pair connected to the emitter of each switching transistor.

8 Claims, 8 Drawing Figures

MONOLITHICALLY INTEGRATED STORAGE CELLS

BACKGROUND OF THE INVENTION

1. Field of the Invention

The invention relates to storage cells used in particular in storage arrangements of digital data processing systems, whereby the storage cells are arranged in a matrix, so that each individual cell can be addressed via corresponding selection means, with binary data being written into or read from it.

2. Description of the Prior Art

Of the great variety of known storage cells, several essential embodiments which relate more closely to the storage cell in accordance with this invention will be identified hereinbelow.

In, for example, commonly assigned U.S. Pat. No. 3,643,235, a storage cell is disclosed which includes a directly cross-coupled, bipolar transistor flip-flop circuit, whose two collector load resistors are two identical active semiconductor devices acting as controllable current sources. The two active semiconductor devices form two complementary transistors with a common base to the flip-flop transistors. For writing and reading information, the emitters of two transistors of the same conductivity type, similar to the emitter-linked flip-flop transistors with common collectors, are connected to a bit line pair. The collectors and the base terminals of these transistors are connected to a common potential, the base terminals being connected to the collectors of the two flip-flop transistors. In comparison with other known storage cells, this known storage cell has a number of advantages, such as low space requirements because of its integrated design, low power constumption in the non-addressed state, high read-write speeds, simple monolithic layout plus simple wiring, few contacts, and, in addition, it can be readily produced and has a high yield and a high degree of reliability.

A modified version of this storage cell is disclosed in commonly assigned U.S. Pat. No. 3,815,106. In comparision with the former storage cell, this latter cell has characteristics which meet even more exacting requirements. It requires fewer metallic lines, so that as a result of the reduction of the difficulties caused by electromigration, a higher degree of reliability, a higher circuit and information density, and thus a higher degree of economy are obtained. An essential feature is that only one metallization layer is required, so that the manufacturing process is simplified, with the yield being increased and the cost being decreased. With this known storage cell the base of each flip-flop transistor is connected to the emitter of an associated complementary addressing transistor, whose collector and base are respectively connected to an associated bit line and an address line. During writing the complementary addressing transistors are inversely operated, injecting current into the base of the associated flip-flop transistor, thus leading to an increase in the write speed. By means of lateral layouts and by merging the zones of the individual semiconductor elements, which are connected to the same potential, the desired simple semiconductor structure is obtained. For this purpose the collector load resistors consist of transistors which are complementary to the flip-flop transistors and whose emitters, base and collectors are respectively connected to a first addressing line, a second addressing line and to the associated flip-flop transistor.

In connection with the further development of the storage cell disclosed in the above cited U.S. Pat. No. 3,643,235, a monolithically integrated storage cell is known which includes a directly cross-coupled bipolar transistor flip-flop circuit, whose two collector load resistors are again two identical transistors acting as controllable current sources and being complementary to the flip-flop transistors which with an emitter arranged in a common base and connected to a common supply voltage potential and collectors arranged laterally thereto are designed as lateral transistors. For the purpose of addressing, the word lines and the supply voltage feed are combined, and the two emitters of the flip-flop transistors are connected to one bit line each of a bit line pair. The storage cell thus designed and operated has improved characteristics in particular with regard to the addressing means required.

In the field of logical circuits with bipolar transistors considerable progress has been made during the past few years, which has attracted great attention on the part of the experts and which under the term Merged Transistor Logic (MTL) or Integrated Injection Logic ($I^2L$) has become widely known in technical literature. Attention is drawn, for example, to articles in the *IEEE Journal of Solid-State Circuits, Vol. SC*-7, No. 5, October 1972, pp. 340 to 346. Relevant U.S. Patents are, for example, U.S. Pat. Nos. 3,736,477 and 3,816,758. This injection logic concept is essentially based on inverting single- or multiple-collector transistors which by the direct injection of minority charge carriers inside the semiconductor body are fed close to their emitter-base junctions (order of magnitude one diffusion length). This bipolar logic concept provides very short switching times. In addition, it is suitable for the manufacture of extremely highly integrated, large-scale logical circuits with a great number of logical elements producible on a single semiconductor chip. For the manufacture of logical circuits in highly integrated technology, essentially three prerequisites have to be fulfilled. The basic circuits must be as simple and space-saving as possible, so that as great a number of them as possible can be arranged on a single semiconductor chip. In addition, the layout of the circuits must be such that an adequate speed does not lead to an excessive increase in the power dissipation on the semiconductor chip, which is tantamount to the requirement that the product of the factors delay time and power dissipation per logical function should be as small as possible. Finally, to obtain a good yield and thus for economical and also for technological reasons the manufacturing process required must be as simple and readily applicable as possible. The inverting logical circuits described are not only outstandingly suitable for the manufacture of logical circuits but they can also be advantageously used as a component for monolithically integrated storage cells, utilizing the fact that in the case of inverting logical circuits two stages each are required to obtain storage cells in the manner of flip-flop circuits. Thus, a storage cell includes two such basic circuits which are symmetrically designed and whereby the output of one basic circuit is connected to the input of the other circuit to fulfill the feedback condition. In this manner the necessary cross-coupling, as exists with conventional flip-flop circuits, is obtained. From the above cited U.S. Pat. No. 3,815,106, a storage cell is known which is made up of two of the logical circuits described and whereby the collector of the inverting transistor of one circuit is in each case cross-coupled with the base of the inverting transistor of the other circuit. The two inverting transistors, in their turn, are inversely operated, forming the actual flip-flop transistors or switching transistors. The complementary transistor of each basic circuit, which is connected via a separate line and via which the minority charge carriers are injected, serves as a load element for both switching transistors. For the purpose of addressing, i.e., for writing and reading the storage cell, the base of each switching transistor is additionally connected to the emitter of an associated additional addressing transistor which is also complementary and whose collector and base are respectively connected to an associated bit line and an address line. Thus, in addition to the injecting transistor forming the load element, an addressing transistor is required which in turn is formed by a lateral transistor structure.

By laterally arranging the two circuits forming a storage cell and by merging the zones connected to the same potential, the desired simple semiconductor structure is obtained. By means of this known storage cell a storage matrix can be produced in which the storage cells are arranged at least in two horizontal lines and in at least four vertical columns. A first vertical address line is associated with the first and the second columns, and a second vertical address line is associated with the third and fourth columns. Furthermore, a first horizontal address line is associated with the first line, and a second horizontal address line is associated with the second line. Finally, a first, a second and a third bit line pair is respectively associated with the first, the second and the third, and the fourth column. For this purpose each bit line pair extends preferably in a vertical direction between the associated columns. The bit lines are in each case connected to the collectors of the addressing transistors, the first address line is connected to the emitters of the transistors forming the load elements and the second address line is connected to the bases of the addressing transistors.

Commonly assigned U.S. application having Ser. No. 763,183, filed Jan. 27, 1977, now abandoned describes an improved I$^2$L storage cell requiring only four transistors, two metal bit lines and a buried layer for addressing.

SUMMARY OF THE INVENTION

It is an object of this invention to provide a monolithically integrated storage cell which with regard to its operation, space requirements, power dissipation, and speed is considerably improved over known storage cells.

In particular it is an object of this invention to provide a storage cell which with a negligible number of addressing means has relatively strong read signals at high read speeds, whereby in spite of the increased packing density, the electrical characteristics are not adversely affected, and whereby it is desirable to use a minimum number of metallization means, i.e., to have as few metallic lines as possible.

Proceeding from the known monolithically integrated storage cell including a flip-flop circuit with two cross-coupled, bipolar switching transistors and one load element each connected by means of one terminal to the collectors of the transistors, the storage cell being controlled via a word line connected to the other terminal of both load elements and via one bit line each of a bit line pair connected to the emitter of each switching transistor, the subject-matter of this invention may be summarized to include a flip-flop circuit made up of two I$^2$L structures integrated in separate isolation pockets of the semiconductor body and comprising in a known manner one injector and one associated transistor each, and that in each case the injector of one of the inverting transistors used as switching transistors simultaneously forms the load element of the other switching transistor. If the switching transistor is designed in each case as an inversely operated, vertical transistor structure within an isolation pocket common to one line of the matrix, then a buried, highly doped zone within an epitaxial layer forming the emitter can be used as a bit line. In such a case merely one line per matrix column, which is connected to the injectors of all the storage cells arranged in the column and which serves as word line, is required as an external line. The use of the injection principle offers advantages particularly with regard to the manufacturing process and the structural layout, a relatively strong read signal at high read speeds being obtained in spite of the minimum number of addressing means required. An extremely high packing density is obtained, without the electrical characteristics of the storage cell being adversely influenced.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Initially, the I$^2$L basic structure shown in the equivalent circuit diagram, the plan view, and the sectional view of FIGS. 1A, 1B, and 1C will be described briefly. This I$^2$L structure realizes the injection principle and is known, for example, from the afore-mentioned U.S. Pat. Nos. 3,736,477 and 3,816,758. The layout and the operation of this structure are described in detail in the aforementioned literature, so that merely a summarizing description need be given here. The designations are chosen in such a manner that they simultaneously indicate the conductivity type of the individual zones. In addition, the semiconductor zones merged in the actual structure and connected to the same potential are provided with the same references.

It is pointed out at this juncture that several modifications and further developments of the I$^2$L basic structure described here have become known, by means of which the storage cell in accordance with the invention can be advantageously realized.

Figure 1A:
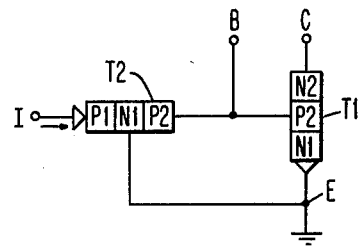
FIG. 1A illustrates an equivalent circuit diagram of a known I$^2$L basic structure serving as a component of the storage cell in accordance with this invention.
Figure 1B:
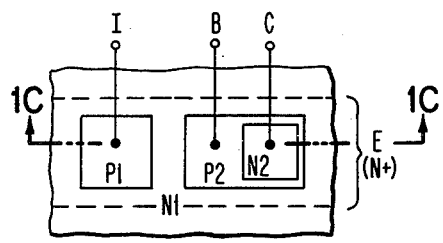
FIG. 1B shows a plan view of one of the known embodiments of the I$^2$L basic structure illustrated in the equivalent circuit diagram of FIG. 1A.
Figure 1C:
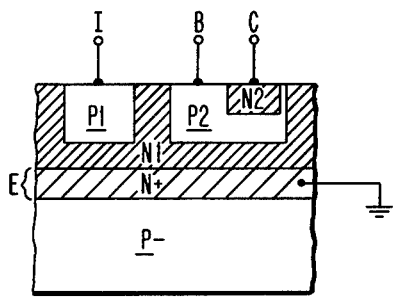
FIG. 1C is a sectional view of the known I$^2$L basic structure of FIG. 1B taken through line 1C—1C.

As may be seen from FIGS. 1B and 1C a lowly doped semiconductor substrate of a first conductivity type, for example, of the P− conductivity type, serves as a starting material. On the semiconductor substrate P− a highly doped, buried zone N+ of the opposite conductivity type is arranged. Over the buried zone N+ an N-doped epitaxial layer N1 is arranged. In the epitaxial layer N1 the oppositely doped zones P1 and P2 are embedded at a certain distance from each other. In zone P2 there is a further zone N2 doped oppositely thereto. The zones P1, P2, and N2 are provided with contacts via terminals I, B, and C. To the buried zone N+ a terminal E is connected. The equivalent circuit diagram of this structure is shown in FIG. 1A, the identical designations of the individual zones permitting a direct comparison between structure and equivalent circuit diagram.

Thus, the inverting logical basic circuit used in accordance with the invention essentially consists of an inverting transistor T1 with the zone sequence N2 P2 N1, which is fed by the direct injection of minority charge carriers.

The inverting transistor T1 is designed as an inversely operated, vertical transistor. For the purpose of minority charge carrier injection, transistor T2 is provided which is complementary to transistor T1. Transistor T2 has the zone sequence P1 N1 P2 and is laterally designed in the structure described. Both transistors are integrated with each other at the highest degree of integration, utilizing common semiconductor zones. The epitaxial layer N1 simultaneously serves as the base zone of the lateral transistor T2 and as the emitter of the vertical transistor T1. The zone P1 forms the emitter of the lateral transistor T2. The zone P2 simultaneously forms the base of the vertical, inverting transistor T1 and the collector of the injecting lateral transistor T2. The zone N2 forms the collector of the inverting transistor T1. At zone P1 forming the emitter of the injecting transistor T2 an injector terminal I is provided, via which a current is externally introduced in the direction of the arrow. This current supplies the operating current for the inverting transistor T1. To zone P2 forming the base of this transistor a control terminal B is connected, via which the state of the inverting transistor T1 is switchable. At the zone N2 collector terminal C is arranged which simultaneously forms the output of the inverting basic circuit. At the buried zone N+ the emitter terminal E of the vertical transistor T1 is arranged.

Figure 2:
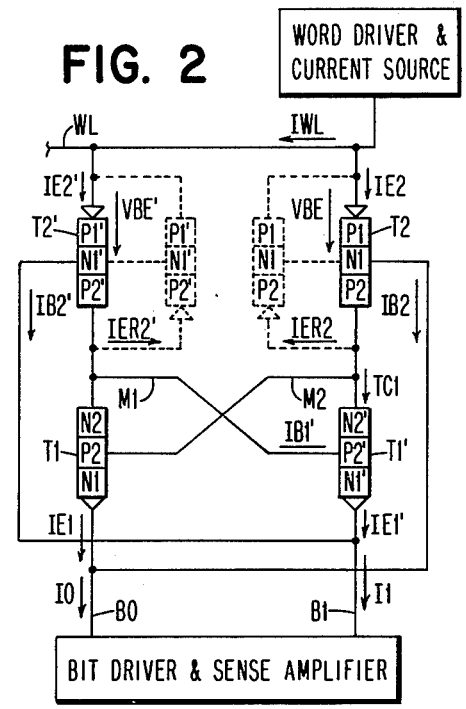
FIG. 2 is the equivalent circuit diagram of a storage cell in accordance with the invention.

In accordance with the invention, the I²L basic circuit described is optimally used in all the essential points by merging two such basic circuits in accordance with FIGS. 1A, 1B and 1C to give a highly integrated storage cell, as shown in the equivalent circuit diagram of FIG. 2. The individual semiconductor zones are provided with the same references as in FIGS. 1A, 1B and 1C, the designations of one of the two basic circuits being prime indexed to permit ready distinction.

The storage cell in accordance with the invention is, in principle, designed in the manner of a flip-flop circuit, the two inverting transistors T1 and T1' forming the actual flip-flop transistors or switching transistors. As load elements the collector circuits of these switching transistors comprise complementary transistors T2' and T2, respectively. For realizing the flip-flop function, the collector of one of the switching transistors is to be connected in each case to the base of the other switching transistor, so obtaining the required mutual feedback. An essential feature in accordance with the invention includes the load element of one branch of the flip-flop simultaneously forming the injector for the switching transistor of the other branch, utilizing the injection principle described above. The injecting transistor T2 forms both the load element of the switching transistor T1' and the injector for the switching transistor T1. The injecting transistor T2' forms the load element of the switching transistor T1 and the injector of the switching transistor T1'. A further essential feature of the storage cell in accordance with the invention includes the two injector terminals of the two injecting transistors T2 and T2' being jointly connected to a word line WL, while the emitter of each switching transistor T1 and T1', respectively, is connected to an associated bit line B0 and B1, respectively, of a bit line pair. It is significant for the storage cell in accordance with the invention that the emitter zones N1 and N1' of the two transistors T1 and T1' at different switching states of these transistors and at an identical current or voltage value applied have a very small voltage or current difference. When the two I²L structures are integrated in separate isolation pockets, the switching state of the storage cell can be read respectively via said isolation pockets and the emitter zones N1 and N1' embedded therein.

As during the addressing of the storage cell the emitter zones N1 and N1' of the two switching transistors thus are connected to different potentials, the two switching transistors are to be arranged in separate isolation pockets in an integrated mono-lithic design, as may be seen from the subsequent description of the structural layout. As the switching transistor of one branch together with the complementary transistor of the other branch, which serves as a load element, form one I²L circuit each in accordance with the invention, the two transistors are to be arranged in one common isolation pocket in accordance with the known I²L basic structure described by means of FIGS. 1A, 1B and 1C. An essential advantage of the storage cell in accordance with the invention is due to the fact that only one word line WL connected to the two injecting transistors T2' and T2 is required as an external or metallic line. The necessary cross-coupling is effected by means of short lines M1 and M2 which connect the collector zone N2 and N2', respectively, of one switching transistor to the base zone P2 and P2', respectively, of the other switching transistor. As will be described below, the two bit lines B0 and B1, connected to the emitter zones N1 and N1', respectively, of the two switching transistors T1 and T1', respectively, are preferably realized by means of buried, highly doped zones N+ arranged in the associated isolation pockets. All further conductive connections shown in the equivalent circuit diagram do not exist in the monolithic structure which in accordance with the I²L basic structure is realized by merging the zones bearing the same designations. The two bit lines B0 and B1 are connected to a bit driver and a sense amplifier, which may be a voltage or current sensing differential amplifier and the word line WL is connected to a word driver and a current source. For the purpose of explaining the function, parallel to the two injecting transistors T2' and T2 two further transistor structures for the respective inverse current direction are shown by broken lines in the equivalent circuit diagram of FIG. 2. These transistors for the inverse current direction do not exist in the structure, since they are identical with the injecting transistor structure. These additional transistor structures in the equivalent circuit diagram are justified, since with a conductive switching transistor T1 or T1', a current IER2' or IER2 is injected back into the respective appertaining injector. This back injected current superimposes the actual injection current IE2' and IE2, respectively.

Figure 3A:
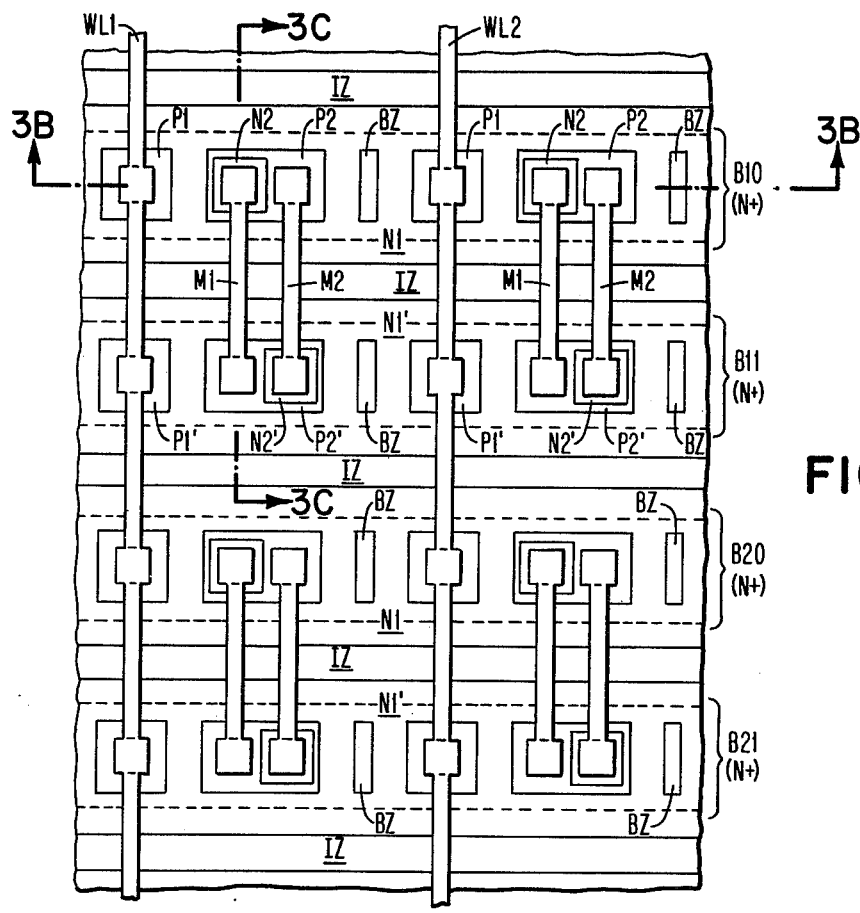
FIG. 3A is a plan view of a section of the structure of a first embodiment of a storage matrix made up of storage cells in accordance with the invention.
Figure 3B:
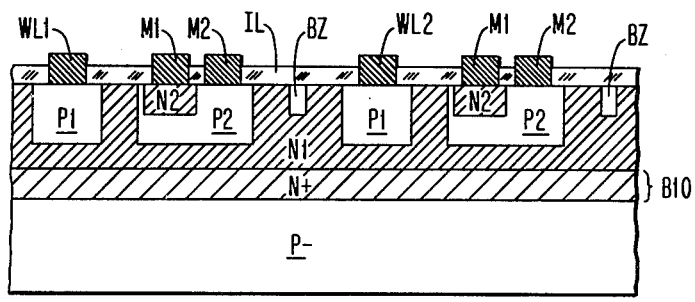
FIG. 3B is a first sectional view of the structure of FIG. 3A taken through line 3B—3B.
Figure 3C:
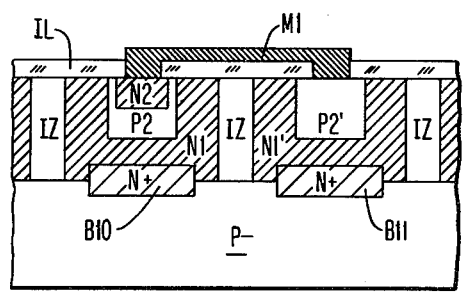
FIG. 3C is a second sectional view of the structure of FIG. 3A taken through line 3C—3C.

The monolithic layout of a storage matrix made up of the storage cells in accordance with the invention is shown by way of a plan view in FIG. 3A and by way of sectional views in FIGS. 3B and 3C. The plan view in FIG. 3A includes two lines and two columns, that means four storage cells of a storage matrix. Each storage cell is made up of two of the I²L basic structures shown in FIGS. 1A, 1B and 1C. The two basic structures forming one storage cell are separated from each other by an isolation zone IZ. The monolithic layout includes an epitaxial layer N1 being applied to a semiconductor substrate P—. This epitaxial layer N1 is subdivided into strips by means of isolation zones IZ extending in line direction. Thus, one line of the matrix comprises two such strip-shaped regions N1 which are isolated from each other by an isolation zone IZ. These isolation zones may be, for example, dielectric zones or P+ doped zones extending right into the substrate P—. In each region N1 there is a continuous buried zone N+ which extends in line direction and which is common to one half of the total number of cells making up a line. These buried zones N+ serve as bit lines B10, B11, B20, and B21. The two I²L basic structures forming a storage cell are arranged one below the other in column direction, comprising, as shown in FIGS. 1A, 1B and 1C, two laterally arranged zones P1 and P2 in the epitaxial layer N1 and a further zone N2 within the zone P2. In this manner a storage cell is obtained which is made up of vertical transistors T1 and T1' with a zone sequence of N2 P2 N1 and N2' P2' N1', respectively, and of associated lateral transistors T2 and T2' with a zone sequence of P1 N1 P2 and P1' N1' P2', respectively, which effect the injection. Cross-coupling is established by two conductive lines M1 and M2 which extend on top of an isolation layer IL covering the whole arrangement, and which contact the zones N2 and P2' and N2' and P2, respectively. In addition, one word line WL1, WL2 is provided for each column of the matrix. By means of this word line all the P1 and P1' zones of the various storage cells of a column, which form the emitters of the lateral, injecting transistors T2 and T2', respectively, are connected to each other. Adjacent storage cells of a line can be isolated from each other by a suitable blocking zone BZ. This blocking zone prevents parasitic couplings between the cell components of two adjacent cells of a line. The blocking zone can be either an N+ diffusion or a P-diffusion connected to a fixed potential, or a passive zone. The blocking zone reduces the effective area required for a storage cell.

Figure 4:
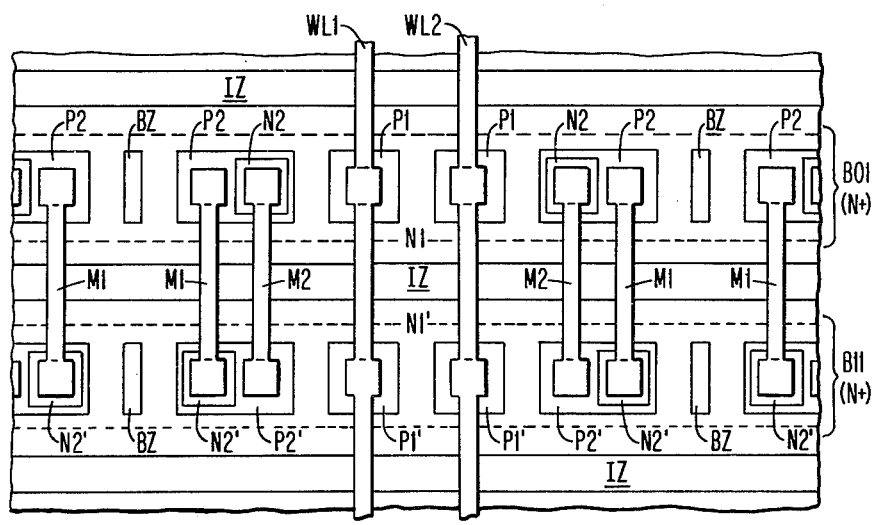
FIG. 4 is a plan view of a section of the structure of a second embodiment of a storage matrix made up of storage cells in accordance with the invention.

An advantageous modification of the storage matrix shown in FIG. 3A is depicted in FIG. 4. In the structure considered here the negative influence of the blocking zones on the area requirements is reduced. Two successive storage cells in the line are arranged mirror-inverted in relation to each other, the injection zones P1 and P1', respectively, of the adjacent cells being spaced from each other at a minimum distance, so that the area requirements for the blocking zone occur only every other storage cell. During the selection of the word line WL2 it must merely be ensured that the adjacent word line WL1 is connected to a fixed potential which is chosen in such a manner that from the injection zones P1 and P1', respectively, associated with the word line WL1 no charge carriers are injected.

With regard to all other points, the storage arrangement in accordance with FIG. 4 corresponds to that of FIG. 3A.

The operation of a storage cell in accordance with the invention will be described in detail below by means of the equivalent circuit diagram of FIG. 2 showing the designations of the operating data necessary for the description of the operational mode. For a practical embodiment typical operating data have been assumed.

In the standby state the two bit lines B0 and B1 are kept at the same potential (about 0 Volt). The emitters P1 and P1' of the two transistors T2 and T2' acting as load elements preferably receive a very low standby current via the word line WL, so that the storage cell operates at very low standby power. As the base-emitter voltages VBE and VBE' of the two transistors T2 and T2' are of the same magnitude, the emitter currents IE2 and IE2' are likewise of the same magnitude, so that for the stability of the storage cell the current amplification of the switching transistors T1 and T1' must merely be larger than one. All storage cells connected to a common word line WL are fed with current IWL from a common current source. Because of the good tracking characteristics of the PNP-transistors T2 and T2' the current is nearly uniformly distibuted to all cells.

For addressing the storage cell, the potential of the word line WL is raised by several hundred millivolts. For reading the information, there are essentially two different operational modes which can also be combined with each other.

With the first mode, the two bit line potentials VBE and VBE' on the two bit lines B0 and B1 are kept at the same value, so that the emitter currents IE1 and IE1' are also identical. (As the potential on the word line is raised by several hundred millivolts, the bit line potentials increase correspondingly). In order to obtain a higher read speed, the current IWL on the word line is increased over that in the standby state. During this process, the non-selected cells on the same bit line pair B0, B1 are practically cut off from the power supply, as the base-emitter voltages of the load transistors T2 and T2' are reduced by about 500 mV. However, the information is maintained for a long time (in comparison with the read time) as a result of the charge stored in the switching transistor capacitances. As the non-selected storage cells carry practically no current during reading, they cannot supply any current to the bit lines B0, B1 either. The selected storage cell, however, supplies different currents I0 and I1 to the bit lines as a function of the storage state of the cell, so that by means of a sense amplifier of the differential current amplifier type connected to the bit lines B0 and B1 the storage state of the cell can be determined. The current difference I0-I1 will be calculated in the following paragraph, assuming that T1' is conductive and that T1 is blocked. This switching state can be associated with a stored binary one, for example. As mentioned above, the two bit lines B0 and B1 are connected to the same potential, so that VBE=VBE' and IE2'=IE2=IE. The bit line current I0 is derived solely from the base current IB2 of the transistor T2 in accordance with $$IO = (1-\alpha 2) \cdot IE, \qquad (1)$$

since the current IER2 injected back via the load transistor T2 in the inverse direction is zero, and since the switching transistor T1 carries no current. The bit line current I1 is composed of $$I1 = (1-\alpha 2')\ IE + (1-\alpha R2') + IER2' + IE1. \quad (2)$$

In many practical cases the base current IB1' is low in relation to the emitter current IE2', so that $$IER2' \approx \alpha 2' \cdot IE2' = \alpha 2' \cdot IE. \quad (3)$$

In such a case the emitter current IE1' is about the same as the collector current IC1' of the transistor T1', which is equal to the collector current of the transistor T2 in accordance with $$IE1' \approx IC1' = \alpha 2 \cdot IE. \quad (4)$$

When equations (3) and (4) are inserted into equation (2) the following equation is obtained:

$$I1 \approx (1-\alpha 2')\ IE + (1-\alpha R2')\ 2' \cdot IE + \alpha 2 \cdot IE. \quad (5)$$

With symmetrical load transistors T2 and T2', $\alpha 2$ and $\alpha 2'$ are of the same value, so that from equation (5) the following equation is derived:

$$I1 \approx [1 + (1-\alpha R2')\alpha 2]\ IE. \quad (6)$$

With regard to the current ration I1/I0, the following is obtained from equations (1) and (6):

$$I1/I0 \approx \frac{1 + \alpha 2 - \alpha 2 \cdot \alpha R2'}{1 - \alpha 2}\ 1 + \frac{\alpha 2(2 - \alpha R2')}{1 - \alpha 2} \text{ or } \quad (7)$$

$$I1/I0 \approx 1 + \beta 2\ (2 - \alpha R2').$$

This current ratio can be indicated by means of a low-resistivity differential amplifier on the bit lines B0, B1, thus permitting the determination of the state of the storage cell.

With the second read method the bit line currents I0 and I1 are kept at the same value, and the resulting bit line voltage difference VBE-VBE' is used to determine the state of the storage cell. This voltage difference is calculated below. From equation (1) the following equation is obtained:

$$IE2 = I0/1 - \alpha 2. \quad (8)$$

From equation (2) the following equation is obtained:

$$I0 = I1 = (1-\alpha 2')\ IE2' + (1-\alpha R2')\ IER2' + IE1'. \quad (9)$$

By means of equations (3) and (4) the following is obtained after corresponding conversion:

$$IE2' = I0 \cdot \frac{1 - 2\alpha 2}{(1 - 2 \cdot \alpha 2' + \alpha 2' \cdot \alpha R2') \cdot (1 - \alpha 2)} \quad (10)$$

With regard to the current ration IE2/IE2', the following equation is obtained from equations (8) and (10):

$$IE2/Ie2' = 1 + \frac{\alpha 2 \cdot \alpha R2'}{1 - 2 \cdot \alpha 2} \quad (11)$$

As $$VBE = VT \cdot \ln \frac{IE2'}{IS}\ (VT \frac{kT}{g} = 26mV$$

at 25° C. being the thermal voltage and IS the inverse saturation current), the value $\Delta V = VT \cdot \ln IE2/IE2'$ or $$\Delta V = VT \cdot \ln \left[ 1 + \frac{2 \cdot \alpha R2'}{1 - 2 \cdot \alpha 2} \right] \quad (12)$$

is obtained for the voltage difference $\Delta V = VBE - VBE'$.

This voltage difference is sensed on both bit lines by means of a high-resistivity differential amplifier.

If the signal amplifier in the case of the current measurement [equation in (7)] has a non-neglectable internal resistance or if the value of the input resistance of the differential amplifier in the case of the voltage measurement [equation (12)] is inadequate, an operating mode results which lies between the two extremes "constant current" and "constant voltage". For the storage cell in accordance with the invention a voltage difference of $$\Delta V \approx 26mV \cdot \frac{\alpha 2 \cdot \alpha R2}{1 - 2 \cdot \alpha 2}$$

is obtained in a practical example according to equation (12) with $\alpha R2' = \alpha R2$ and $\alpha 2 \cdot \alpha R2' < 1$. At $\alpha 2 > \alpha R2$ and $\alpha 2 = 0.3$, and $\alpha 2' = 0.2$ this results in a voltage difference of $\Delta V = 3.9$ mV.

This value of $\Delta V$ is fully sufficient to be amplified with the aid of a tolerable number of technical means.

The write process is relatively simple. As during reading, the word line potential is raised by about 0.5 V. If, for example, the switching transistor T1' is to be cut off, the potential on bit line B1 is rasied to an extent that no emitter current IE2' and thus no base current IB1' can flow into the switching transistor T1'.

FIGS. 3A, 3B, 3C and 4 show that the storage cell can be realized at very low space requirements. in particular with modern isolation techniques (passive isolation by means of oxide, for example,) the storage cell density is considerably increased over that of known storage cells, because only one metal line, namely the word line WL, is required to wire the cell in a storage matrix. As a result of the reduced number of metal lines, the reliability is considerably increased, and the blocking zones employed prevent two adjacent storage cells of a bit line from being coupled.

While the invention has been particularly shown and described with reference to the preferred embodiments thereof, it will be understood by those skilled in the art that various changes in form and details may be made therein without departing from the spirit and scope of the invention.

What is claimed is:

1. A monolithically integrated storage matrix having a storage cell comprising:
   a flip-flop circuit including first and second cross-coupled bipolar, inverting transistors each having emitter, base and collector electrodes and first and second injectors each having first and second terminals, the first terminal of said first injector being connected to the base electrode of said first inverting transistor and to the collector electrode of said second inverting transistor and the first terminal of said second injector being connected to the base electrode of said second inverting transistor and to the collector electrode of said first inverting transistor, control means including a word line connected to the second terminal of said first and second injectors and first and second bit lines, said first bit line being connected to the emitter electrode of said first inverting transistor and said second bit line being connected to the emitter electrode of said second inverting transistor, and a substrate having first and second isolation pockets, said first injector and said first inverting transistor being disposed in said first pocket and said second injector and said second inverting transistor being disposed in said second pocket, whereby said first and second injectors form load elements for said second and first inverting transistors, respectively.

2. A monolithically integrated storage matrix having a storage cell as set forth in claim 1 wherein each of said inverting transistors includes first and second regions of a given type conductivity forming said emitter and collector electrodes separated by a third region of an opposite type conductivity forming said base electrode and each of said injectors is a complementary transistor including a fourth region of said opposite type conductivity, said first region and said third region, said fourth region forming an emitter electrode for said complementary transistor, the regions of each of said inverting transistors being arranged vertically and the region of each of said complementary transistors being arranged laterally in said isolation pockets.

3. A monolithically integrated storage matrix having a storage cell as set forth in claim 2 wherein said word line is connected to the fourth region of each of said complementary transistors and said first and second bit lines are highly conductive buried zones of said given type conductivity disposed within said isolation pockets.

4. A monolithically integrated storage matrix as set forth in claim 3 comprising a plurality of said storage cells wherein said first and second isolation pockets are arranged parallel to each other and support at least first and second of said cells, said first bit line being disposed within said first isolation pocket and connected to said first and second cells and said second bit line being disposed within said second isolation pocket and connected to said first and second cells.

5. A monolithically integrated storage matrix as set forth in claim 4 further including a blocking zone disposed within each of said isolation pockets between said first and second cells.

6. A monolithically integrated storage matrix as set forth in claim 4 wherein said first and second cells are arranged within said isolation pockets in mirror-inverted relation to each other with the first and second injectors of said first cell being desposed adjacent to the first and second injectors of said second cell, and further including a blocking zone disposed within each of said isolation pockets at the end of said first and second cells remote from said injectors.

7. A monolithically integrated storage matrix having a storage cell as set forth in claim 2 wherein said first and second regions are semiconductor regions of N type conductivity and said third and fourth regions are semiconductor regions of P type conductivity.

8. A monolithically integrated storage matrix having a storage cell as set forth in claim 7 wherein said first and second bit lines are highly conductive semiconductor zones of N type conductivity and said substrate is a semiconductor substrate made of P type conductivity.

* * * * *